US012614988B2

(12) United States Patent
Huang et al.

(10) Patent No.: US 12,614,988 B2
(45) Date of Patent: Apr. 28, 2026

(54) LOW PARASITIC INDUCTANCE POWER MODULE FEATURING STAGGERED, INTERLEAVING CONDUCTIVE MEMBERS

(71) Applicant: SENTEC E&E CO., LTD., Taoyuan (TW)

(72) Inventors: Jason An Cheng Huang, Taoyuan (TW); Kun-Tzu Chen, Taoyuan (TW); Liang-Yo Chen, Taoyuan (TW); Nai-His Hu, Taoyuan (TW); Siao-Deng Huang, Taoyuan (TW)

(73) Assignee: SENTEC E&E CO., LTD., Taoyuan (TW)

( * ) Notice: Subject to any disclaimer, the term of this patent is extended or adjusted under 35 U.S.C. 154(b) by 411 days.

(21) Appl. No.: 18/196,164

(22) Filed: May 11, 2023

(65) Prior Publication Data

US 2024/0063726 A1     Feb. 22, 2024

Related U.S. Application Data

(63) Continuation-in-part of application No. 17/892,008, filed on Aug. 19, 2022, now Pat. No. 12,417,967.

(51) Int. Cl.
| | |
|---|---|
| *H01L 23/00* | (2006.01) |
| *H02M 7/00* | (2006.01) |
| *H05K 1/02* | (2006.01) |
| *H05K 1/181* | (2026.01) |

(52) U.S. Cl.
CPC .......... *H02M 7/003* (2013.01); *H05K 1/0216* (2013.01); *H05K 1/181* (2013.01)

(58) Field of Classification Search
CPC .............................. H01L 25/072; H01L 24/49
See application file for complete search history.

(56) References Cited

U.S. PATENT DOCUMENTS

2011/0051371 A1* 3/2011 Azuma .................. B60K 6/445
361/699

FOREIGN PATENT DOCUMENTS

JP          2005261035 A  *  9/2005

* cited by examiner

*Primary Examiner* — Michele Fan
(74) *Attorney, Agent, or Firm* — Che-Yang Chen; Law Office of Michael Chen

(57)                ABSTRACT

A low parasitic inductance power module featuring staggered, interleaving conductive members, including: at least one base extending in a length direction, at least one input bus-bar and at least one output bus-bar being disposed on the base; a first unit including a first circuit base portion disposed on the base along the width direction, a plurality of first power devices being disposed on the first circuit base portion, each of the first power devices having paralleled first current input ends and paralleled first current output ends; the first current input ends or the current output ends being conductively connected to the first circuit base portion; and a second unit. The units are serially connected to the bus-bars via staggered, interleaving input conductive members and output conductive members whereby individual inductances generated are mutually counteracted, thus reducing the overall parasitic inductance.

7 Claims, 10 Drawing Sheets

50

60

52

PRIOR ART

PRIOR ART

LOW PARASITIC INDUCTANCE POWER MODULE FEATURING STAGGERED, INTERLEAVING CONDUCTIVE MEMBERS

FIELD

The present disclosure relates to a power module, and more particularly relates to a low parasitic inductance power module featuring staggered, interleaving conductive members.

BACKGROUND

As one of trending technologies, third-generation semiconductors play a pivotal role in the development of 5G, electric vehicles (EVs), and regenerative energies. The third-generation semiconductors (or wide bandgap (WBG) semiconductors) generally refer to Silicon Carbide (SiC) or Gallium Nitride (GaN), the bandgap of which is about three times that of conventional semiconductors like Silicon (Si) and Gallium Arsenide (GaAs). The larger bandgap allows WBG power devices to operate in a high-frequency, high-temperature, high-current, high-voltage environment, achieving optimum efficiency and stability in general.

Among various applications of the third-generation semiconductors, demands from electric vehicles are undoubtedly a main driving force for the development of power semiconductor devices. The core technologies for electric vehicles refer to "battery," "motor," and "power control unit," which are briefly introduced here: first, a three-phase motor is the heart of an electric vehicle, which leverages an induced RMF (Rotating Magnetic Field) to actuate the rotor in the motor to rotate to further drive the shaft; to induce the RMF, the three-phase motor is actuated by alternating current (AC) with phase difference; however, a battery pack (e.g., a lithium battery) equipped to the electric vehicle is a direct-current (DC) power supply, such that a DC-to-AC conversion is needed between the battery pack and the motor, while this conversion is implemented via an inverter, the brain of the electric vehicle.

The inverter not only serves to convert the input DC current into an AC signal, but also may control the three-phase motor via a technology such as pulse width modulation (PWM). The inverter is essentially a power module comprising the power semiconductors above, which performs electric control of the motor via circuit design. For example, the faster the RMF revolves, the higher the speed of the rotor in the motor is, in which the speed of rotation of the RMF is dictated by the frequency of AC signal, i.e., the electric vehicle may directly change its motor speed by controlling the frequency of the input current, which offers a more reliable, linear control than a conventional ICE (Internal Combustion Engine) mechanism. In addition, the magnitude of current inputted in the motor also has a direct impact on intensity of the induced magnetic field. Therefore, an electric vehicle with a high power output surely needs a power module that can handle high current.

According to the Ampere's Law, in an AC circuit, a time-varying magnetic field is created when electric current travels through a wire or a power component, while according to Faraday's Law and Lenz's Law, the time-varying magnetic field in turn creates a counterforce opposing the induced electromotive force, which influences the current signal. This effect, due to its analogousness to inductance, is usually referred to as "parasitic inductance" or "stray inductance," which is practically unwanted as it hinders fast transform of current signals. Usually, such effect may be ignored in the case that the frequency is not high; however, in a high-frequency, high-current operating condition, the impact of stray inductance will become increasingly exacerbated, which likely results in phase delay or phase lead of signals, causing distortion of the overall signal, thereby affecting transmission and conversion efficiency, degrading stability, and significantly affecting the motor's efficiency in converting the electric energy to mechanical energy.

The previously filed U.S. Pat. No. 10,405,450 reveals problems such as voltage overshoot and ringing induced by parasitic inductance in a high-power module; besides, a power module of paralleled architecture further has a problem of inhomogeneous temperature distribution due to current imbalance. All of the above factors will result in circuit system instability, degraded conversion efficiency, or even restricted maximum switching frequency. As illustrated in FIG. 1 accompanied to the present disclosure, the U.S. Pat. No. 10,405,450 provides a solution of reducing circuit length, increasing cross-sectional area of conductors, creating counteracting magnetic fields, minimizing module height, and placing the power device in closer proximity to the end points, in which solution after the current traveling through the two power devices 7 along the current direction 8, a return zone 9 is formed at the output bus-bar, which may reduce the locally induced parasitic inductance. However, the disclosed layout manner has a limited effect in reducing parasitic inductance since the output bus-bars located obliquely above the center of the topology can only be placed in close proximity to the circuit below within the restricted range in the center while in the right side of the topology, the output bus-bar needs to be spaced from the circuit with a certain distance so as to avoid the bonding zone. Furthermore, as illustrated in FIG. 2 accompanied to the present disclosure, the U.S. Pat. No. 8,637,964 also discloses a low stray inductance power module, in which the reflow current is designed as much close as possible to the original current path, such that in the current direction 8, a current reflow path is likewise formed in the power module. However, in the case of a high current, high frequency transformation, this horizontally dual-loop layout would result in inhomogeneous current due to inconsistent travelling distances between the inner track and the outer track of each loop; in addition, the outer track portions are relatively distant from each other, which restricts the stray inductance counteraction effect.

In view of the above, parasitic inductance is unwanted, but unavoidably present in a high-frequency circuit. To address this problem, the inventors of the present disclosure have conducted researches on the current path in a power module and already filed relevant invention patent applications. However, in subsequent studies, the inventors find that the earlier power modules still need improvement.

SUMMARY

Embodiments of the present disclosure provide a low parasitic inductance power module, which significantly reduces induced parasitic inductance by paralleling the high current signals via a structure with staggered, interleaving conductive members.

Embodiments of the present disclosure provide a low parasitic inductance power module, wherein a high current signal is uniformly distributed and symmetrically flows through a loop where conductive members are arrayed in a staggered, interleaving manner, such that the overall conductive loop is uniformly distributed in a transversal layout, whereby time lag issue of a high-speed signal attributed to inhomogeneous transversal distribution is effectively reduced.

Embodiments of the present disclosure provide a low parasitic inductance power module, wherein the current input bus-bars and current output bus-bars are disposed at side edges, facilitating circuit leading-out.

Embodiments of the present disclosure provide a low parasitic inductance power module, which renders a higher scalability in designing a circuit structure for the low parasitic inductance power module by a staggered, interleaving configuration enabling shift between horizontal and vertical directions.

The low parasitic inductance power module featuring staggered, interleaving conductive members according to the present disclosure comprises: at least one base extending along a length direction, the base having two opposite side edges in the length direction, at least one current input bus-bar and at least one current output bus-bar which are mutually insulative being parallel arrayed along a width direction perpendicular to the length direction; a first unit comprising a first circuit base portion, the first base portion being disposed on the base along the width direction, a plurality of first power devices being provided on the first circuit base portion in a uniformly staggered fashion, each of the first power devices having a first current input end and a first current output end, the first current input ends of all first power devices being parallel connected, the first current output ends of all first power devices being parallel connected, wherein the first current input ends are conductively mounted to the first circuit base portion, or alternatively, the first current output ends are conductively mounted to the first circuit base portion; and a second unit comprising a second circuit base portion, the second circuit base portion being disposed on the base along the width direction, the second circuit base portion being spaced from the first circuit base portion in the length direction, a plurality of second power devices being disposed on the second circuit base portion in a uniformly staggered fashion, each of the second power devices having a second current input end and a second current output end, the second current input ends of all second power devices being parallel connected, the second current output ends of all second power devices being parallel connected, wherein the second current input ends are conductively mounted to the second circuit base portion, or alternatively, the second current output ends are conductively mounted to the second circuit base portion; wherein one end of the first unit and one end of the second unit are serially connected along the length direction via a plurality of serial-connection conductors which are configured in a mutually staggered fashion, respectively; the opposite other end of the first unit and the opposite other end of the second unit are serially connected to the current input bus-bar and the current output bus-bar via a plurality of input conductive members which are configured in a mutually staggered fashion and a plurality of output conductive members which are configured in a mutually staggered fashion, respectively; and when the serial-connection conductors, the input conductive members, and the output conductive members have their positions correspond in the length direction, their projections on a plane formed by the length direction and the width direction are arrayed in a staggered, interleaving fashion, and their projections on a plane formed by the length direction and a height direction perpendicular both to the length direction and the width direction are intersected with each other; whereby the staggered serial-connection conductors, the staggered input conductive members, and the staggered output conductive members create individual inductances which are mutually cancelled when current flows therethrough, reducing overall parasitic inductance.

According to the low parasitic inductance power module as disclosed, a high current signal inputted in the module is evenly shared by paralleled power semiconductors such as SiC and GaN, wherein each power semiconductor, mated with a plurality of wires, is distributed in the width direction, such that lengthwise interconnection of the power semiconductors enables the high current to be stably inputted and outputted in a shared mode; particularly, the uniform distribution of the power semiconductors in the width direction further reduces the time lag in high-frequency signal transmission caused by different lengths of widthwise circuit routes; moreover, the induced magnetic fields generated by individual wires will be mutually cancelled by the opposite induced magnetic fields within a near range, whereby the parasitic inductance effect generated by the high-frequency current is effectively reduced via round-trip design of the uniformly staggered, interleaving wires. Particularly, irrespective of staggering of the projections in the plane formed by the length direction and the width direction, or intersecting of the projections in the plane formed by the length direction and the height direction, or even interleaving of the projections in both plane directions, the height limitation or width limitation of users with different structural needs may be satisfied to yield a high power module with optimal high-frequency response and electric performance, with effective reduction of the adverse effect of parasitic inductance; moreover, the current input bus-bar and the current output bus-bar may be opted to be arrayed at the side edges, which facilitates circuit leading-out; in this way, use demands are satisfied and the drawbacks in conventional technologies are overcome.

DETAILED DESCRIPTION

Figure 1:
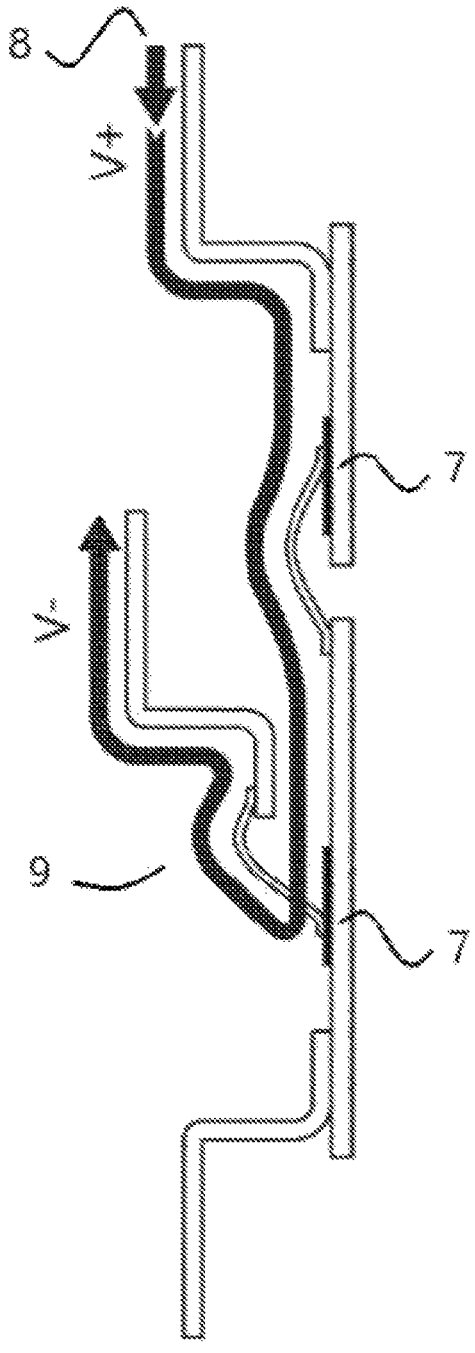
FIG. 1 is a schematic diagram of a conventional technology.
Figure 2:
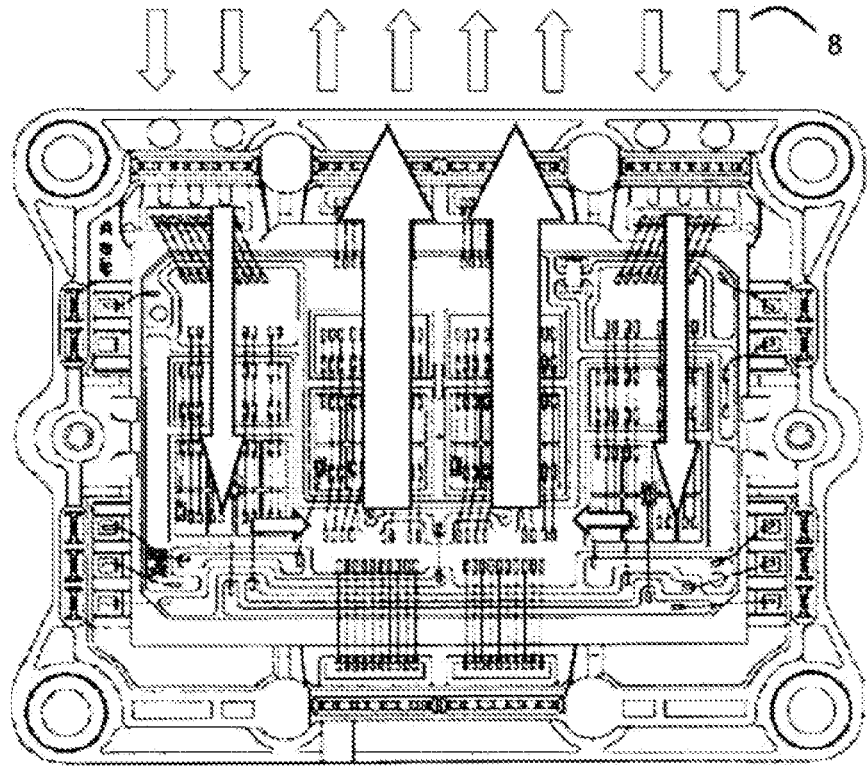
FIG. 2 is a schematic diagram of another conventional technology.

Relevant technical contents, features and effects of the present disclosure may be apparent through the examples described below with reference to the accompanying drawings, in which like or similar components in various examples are represented with like or similar reference numerals.

Figure 3:
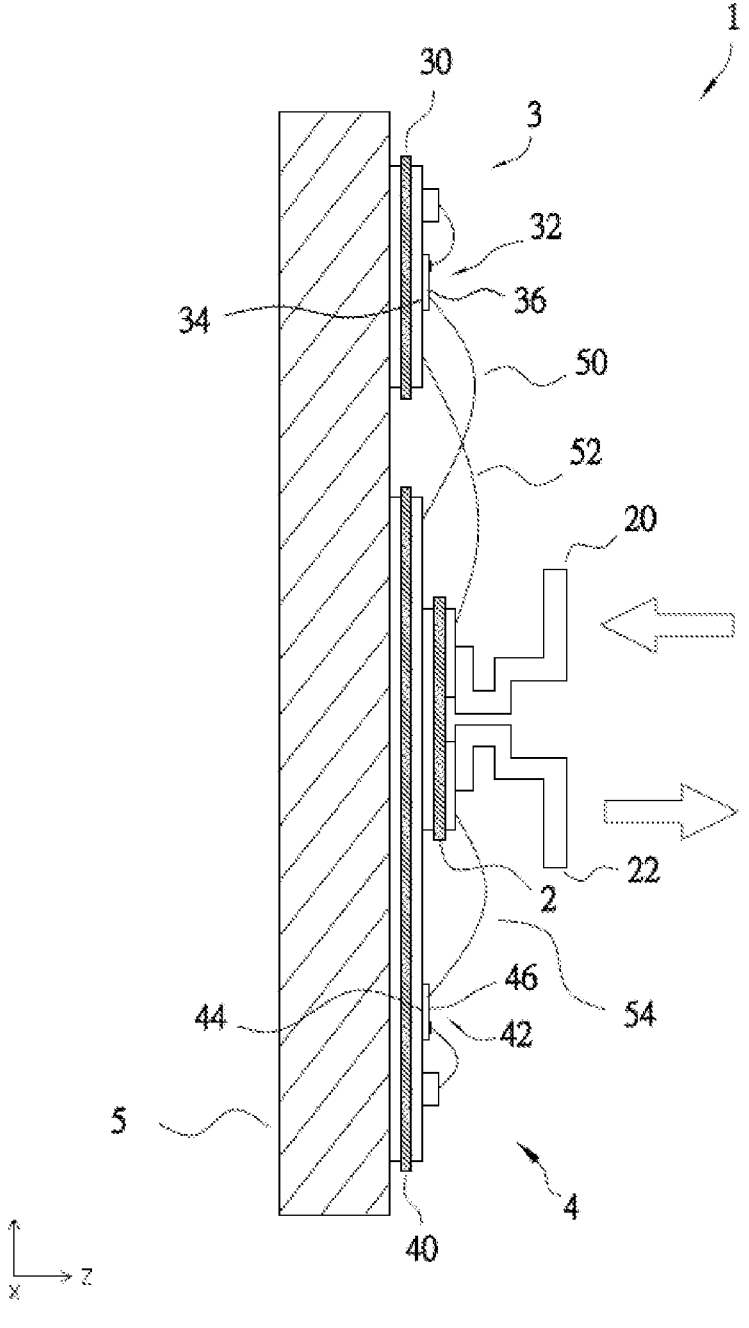
FIG. 3 is a schematic side view of a first example of the present disclosure, illustrating how to array input conductive members, output conductive members, and serial-connection conductors such that their respective projections are intersected in the plane formed by the length direction and the height direction.
Figure 4:
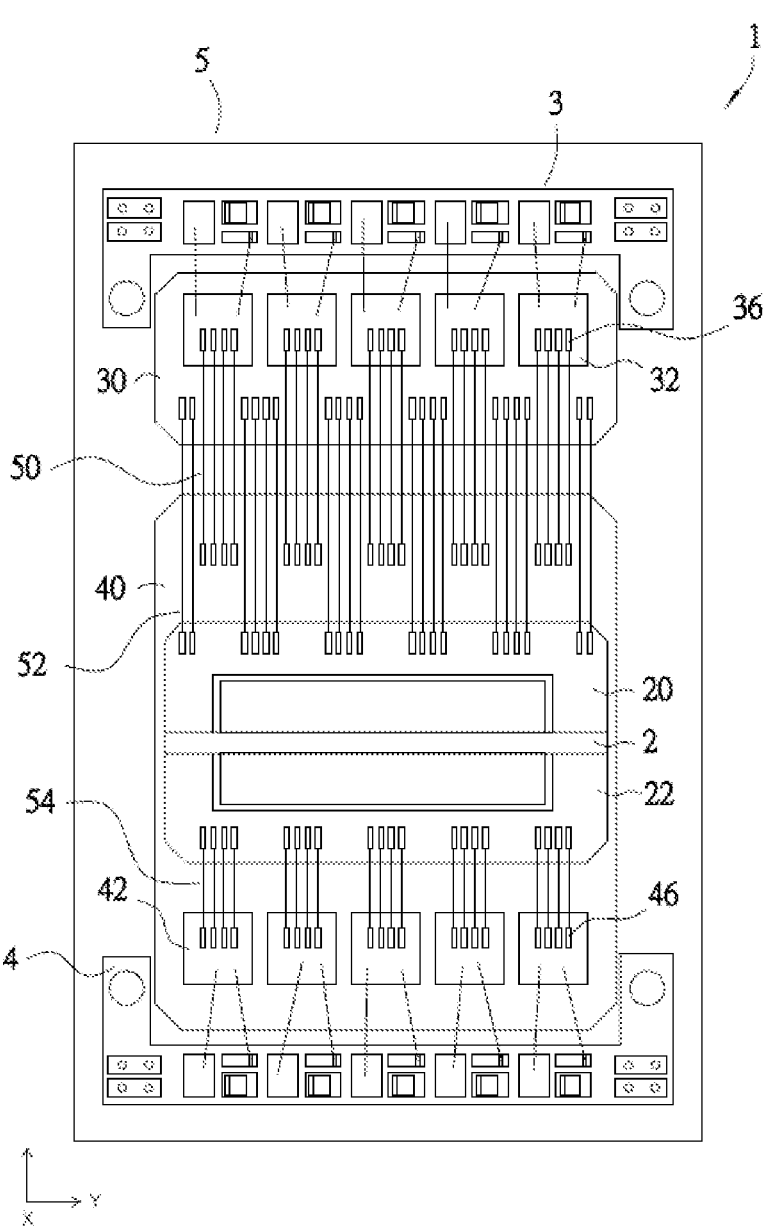
FIG. 4 is a top view of the example of FIG. 3, illustrating how the input conductive members, the output conductive members, and the serial-connection conductors are arrayed such that their respective projections are staggered and interleaved in the plane formed by the length direction and the width direction and how the stray inductances are mutually cancelled in the round-trip process of the circuit.
Figure 5:
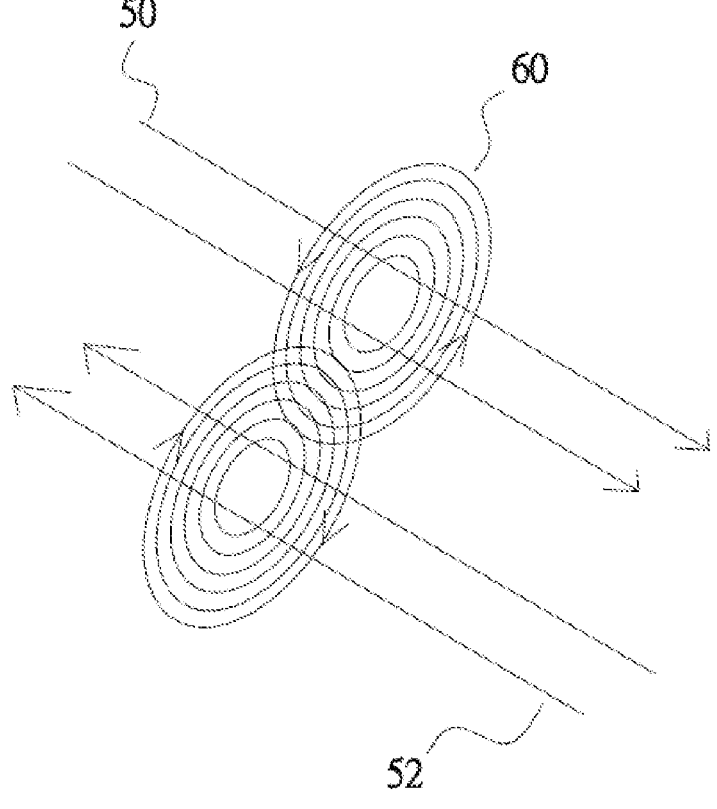
FIG. 5 is a schematic diagram of current route projections of the example of FIG. 3, illustrating the principle of parasitic inductance cancellation.

FIGS. 3 to 5 illustrate a low parasitic inductance power module 1 according to a first example of the present disclosure, comprising: an electrically insulated base 5, on which a first circuit base portion and a second circuit base portion are disposed. In this example, the first circuit base portion and the second circuit base portion refer to a first circuit board 30 and a second circuit board 40 which are mutually insulative, respectively. For the sake of easy description, the two circuit boards are arrayed along length direction X defined in the present disclosure, while the horizontal direction in FIG. 3 is defined as height direction Z, and the direction normal to the paper surface is defined as width direction Y. In this example, the electrically insulated base 5 is made of a metal material, the upper surface of which may be anodized, whereby a cooling device (not shown) may be disposed underneath power devices. In this example, as illustrated in the figures, the second circuit board 40 has a width equal to that of the first circuit board 30, but a greater length, allowing for disposing a substrate 2 above the second circuit board 40. The purpose for this design will become more apparent through the detailed description below. A current input bus-bar 20 and a current output bus-bar 22 are further disposed over the substrate 2, for inputting a high current signal (tens to hundreds of amperes) into the module.

In this example, a first unit 3 is conductively connected to the current input bus-bar 20, the first unit 3 comprising a first circuit board 30 extending along the width direction Y; five, for example, first power devices 32 in average are disposed on the first circuit board 30 along the width direction. In this example, the first power devices 32 refer to power transistors made of SiC. Of course, in an alternative example, other types of power transistors may be selected depending on specific applications, and the number of the power transistors may be adjusted as well; therefore, the exemplary illustration here should not be construed as limiting. In this example, the first circuit board 30 refers to a direct-bond copper (DBC) circuit board mounted on the insulated base 5; the input current entering from the current input bus-bar 20 flows through a plurality of paralleled input conductive members 52 into the first power devices 32. For the sake of easy illustration, the electrodes underlying the first power devices 32 and conductively welded to the first circuit board 30 are defined as first current input ends 34, and the top sides opposite the first current input ends 34 are defined as first current output ends 36. In this example, the input conductive members 52 refer to twenty wires which are parallel connected and staggered bonded to the first circuit board 30; this allows for even sharing of an input high current of tens to hundreds of amperes, effectively mitigating the current heating effect generated by each conductive member.

In the first unit 3 of this example, each of the first power devices 32 is synchronously controlled by a first gate signal. The first gate signal activates conduction between the source and drain of individual power transistors, such that the input current signal is transmitted from the plurality of paralleled first current output ends 36 through serial-connection conductors 50 to the second current input ends 44 of the second power devices on the second circuit board 40. During the process of the current signal entering and exiting the first unit 3, the traversed circuit includes the serial-connection conductors 50 and the input conductive members 52. In this example, 40 wires are configured to form a structure where projections of the 40 wires are intersected in a three-dimensional space. Since the paralleled first power devices 32 are uniformly distributed in the width direction, the current signal mainly flowing along axis X is uniformly distributed in direction Y, the length difference between paths is minimized, and the path difference between the gate signals is also shortened, whereby the phase difference of the high-frequency signal is effectively reduced.

To facilitate illustration, in the present disclosure, individual first power devices 32 serve as demarcations; as shown in FIG. 4, the path along which the current flows from the current input bus-bar 20 into the respective first current input ends 34 via twenty input conductive members 52 and then enters the first power devices 32 is defined as a current input half, while the path along which the current flows from the first current output ends 36 and is transmitted via 20 serial-connection conductors 50 to the second circuit board 40 and then into the second power devices is defined as a current output half.

After the three-dimensional coordinates of each circuit or wire have been defined along length direction X, it may be viewed from the projections at corresponding positions where their lengthwise coordinates correspond in the plane formed by the length direction and the width direction in FIG. 4 that in the current input half, the 20 aluminum strips as the input conductive members 52 are configured such that two aluminum strips are disposed at each of the outermost sides, and four aluminum strips are disposed at each line in the middle; while in the current output half, the aluminum strips as the serial-connection conductors 50 and the output conductive members 54 are arrayed with four in a group. In the current input half and the current output half, the traces between adjacent groups of input conductive members 52 and groups of serial-connection conductors 50 are arrayed in a staggered, interleaving fashion. Viewed from the projections in the side-view X-Z plane formed by the length direction X and the height direction Z as illustrated in FIG. 3, the traces between respective groups of input conductive members 52 and respective groups of the serial-connection conductors 50 are intersected. At this point, in the three-dimensional space, the 40 conductive members (20 for the current input half and 20 for the current output half) are interleaved for example with four in each group in the width direction and the height direction, while at the outermost sides in the width direction, two conductive members are in one group; with this staggered, interleaving layout, every two serial-connection conductors 50 are in close proximity to every two input conductive members 52, as shown in FIG. 5; finally, according to the Ampere's Law, i.e., the magnetic field path integral of a closed loop is proportional to magnitude of the current traveling through the closed loop, it may be derived that the magnetic field path integral of the magnetic field integral path 60 at the closed loop encompassing four routes of current is zero, thereby achieving local inductance cancellation.

Since the serial-connection conductors 50 evenly distribute the current to the second circuit board 40 along the width direction, their projections are also arrayed in a staggered, interleaving fashion with those of the output conductive members 54 along the X-Y direction, which means the serial-connection conductors 50 and the output conductive members 54 almost travel the same path along the length direction X, which may also achieve local inductance cancellation. In this example, the conductive members do not extend exactly along direction X, but have components in width direction Y and height direction Z; however, those skilled in the art should understand that this staggered, interleaving loop design may ensure sufficiently uniform distribution of the overall current, which avoids synchronous delay between respective power devices, while maintaining a round-trip loop structure where the input and output routes are in very close proximity in the three-dimensional space, which may reduce the overall stray inductance of the power module to under 5 nH, or even under 2 nH. Compared with the distant loop designs in the above-identified patents, the present disclosure offers a more homogenized current distribution. Through the Ampere's Law analysis, the present disclosure also achieves a far smaller path integral than the above-identified patents, which eliminates a need of extending the integral area to cover the cross section of the overall module; in other words, even the above-identified patents had proposed a theoretical concept of reducing stray inductance, their overly large round-trip current distribution area not only results unevenness of current distribution, but also results in a very wide integral cross-sectional area for stray inductance cancellation; therefore, their practical effect of counteracting the induced magnetic field is limited. In contrast, the staggered, interleaving design of the present disclosure achieves a better parasitic inductance cancellation effect.

Similarly, after the current signal arrives at the second unit 4 through the first unit 3, it will enter the respective second power devices 42 via respective second current input ends 44. As described above, the second power devices 42 are also controlled by a corresponding gate signal, such that the overall current is finally conducted into the current output bus-bar 22 via the second current output ends 46 and the output conductive members 54 and then outputted; likewise, the second unit 4 is also designed with a structural topology where the input currents and the output currents are staggered from and interleaved with each other; this allows for significant cancellation of the stray inductance in the second half like in the first half. In this example, both of the first circuit board 30 and the second circuit board 40 are direct-bond-copper (DBC) circuit boards, which are structurally disposed exactly beneath the output conductive members 54; over the second circuit board 40 is further provided a substrate 2 where the current input bus-bar 20 and the current output bus-bar 22 are arrayed in a mutually insulated, parallel, and spaced manner, such that the current flowing across the substrate and the current flowing across the second circuit board 40 are in opposite directions, but uniformly distributed. Although the overlap here does not achieve completely "staggered interleaving", the upper-lower overlap in direction Z and the mutually paralleling and proximity structure can still yield some effect of parasitic inductance reduction, leaving no dead zone in the circuit topology design featuring stray inductance counteraction. Although the example above adopts an upper-lower overlapping and parallel configuration between the second circuit board and the substrate in direction Z, the circuit configuration of the present disclosure is not limited to such a solution.

Figure 6:
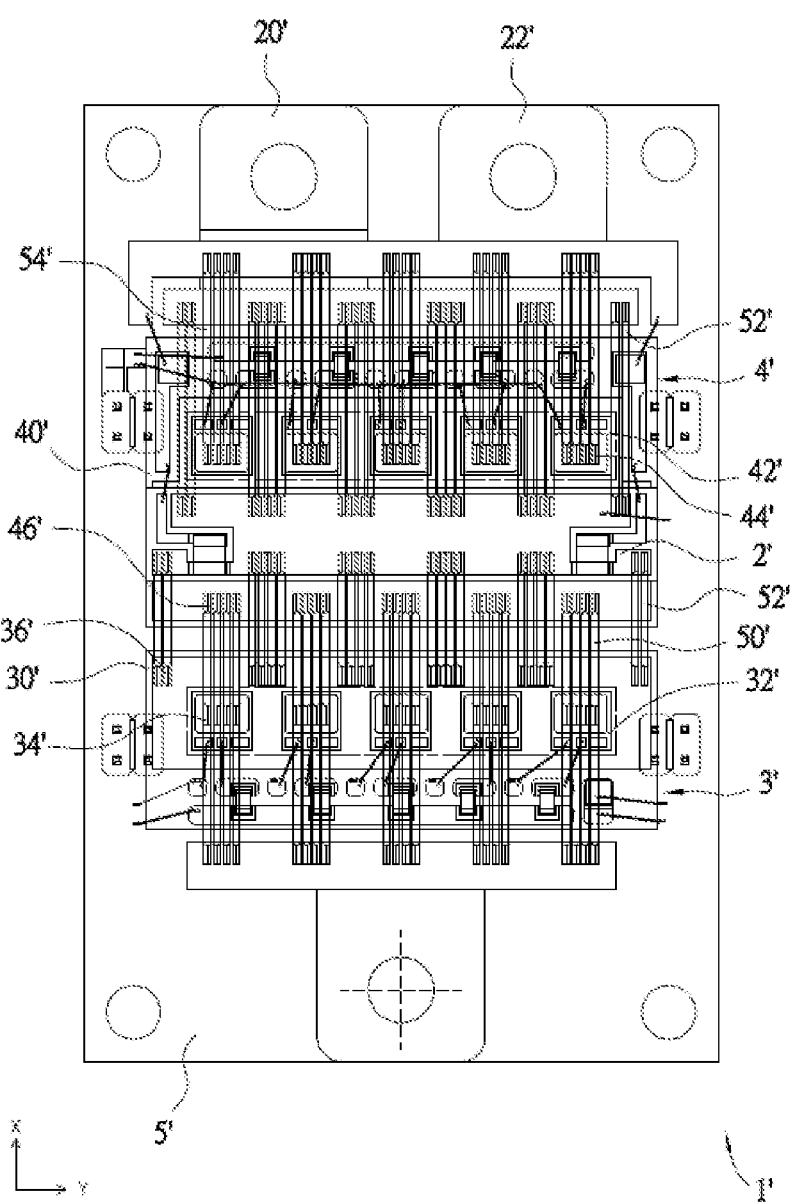
FIG. 6 is a top view of a second example of the present disclosure.
Figure 7:
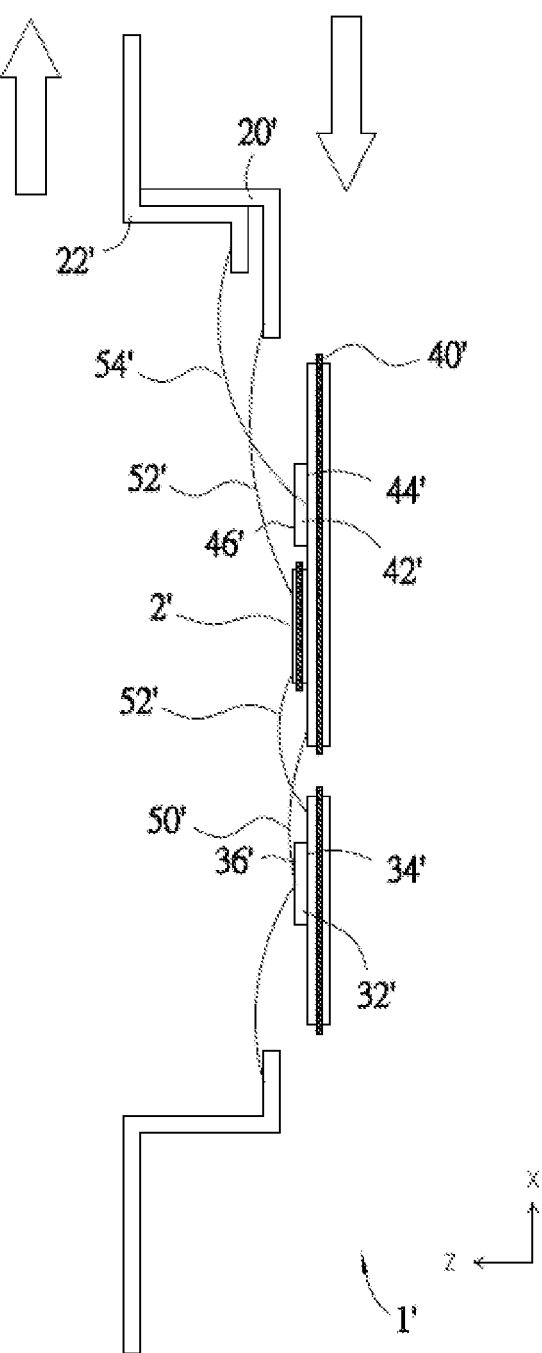
FIG. 7 is a side view of the example of FIG. 6.

Although the current input bus-bar and the current output bus-bar in the example above are disposed in the central part of the substrate, it is also desired by some user to reduce the overall height of the power module and change the positions where the current input bus-bar and the current output bus-bar are disposed. Therefore, FIGS. 6 and 7 illustrate a second example of the present disclosure, in which the parts such as the first unit 3', the first circuit board 30', the first power devices 32', the first current input ends 34', the first output ends 36', the second unit 4', the second circuit board 40', the second power devices 42', the second current input ends 44', the second current output ends 46', and the serial-connection conductors 50', as well as definitions of direction X, direction Y, and direction Z, which are the same as those in the first example, will not be detailed here.

This example differs from the first example mainly in that the current input bus-bar 20' and the current output bus-bar 22' are disposed at positions closer to the side edges of the base 5' and an elevated board 2' is provided above the second circuit board 40', such that in the route along which the input conductive member 52' spans over the second circuit board 40' from the input bus-bar 20' and is then conductively connected to the first current input ends 34', the input conductive members 52' may be mutually insulative with respect to the current output half below but still keep close proximity therewith in the spatial layout, whereby the parasitic inductances may be still counteracted. Of course, the staggered interleaving of the projections of the input conductive members, the serial-connection conductors, and the output conductive members of the overall conductive loop in the X-Y plane and the intersection of the above in the X-Z plane are necessary configurations for ensuring parasitic inductance reduction. This arrayment of the current input bus-bar 20' and the current output bus-bar 22' further facilitates circuit leading-out. In addition, the first power devices 32' and the second power devices 42' are uniformly staggered distributed in the width direction; in conjunction with uniform distribution of the overall circuit, the current input busbar and the current output bus-bar in the width direction, the route difference of the circuit loop in the width direction is also minimized, whereby time lag of the high-frequency signal in transmission is reduced.

Figure 8:
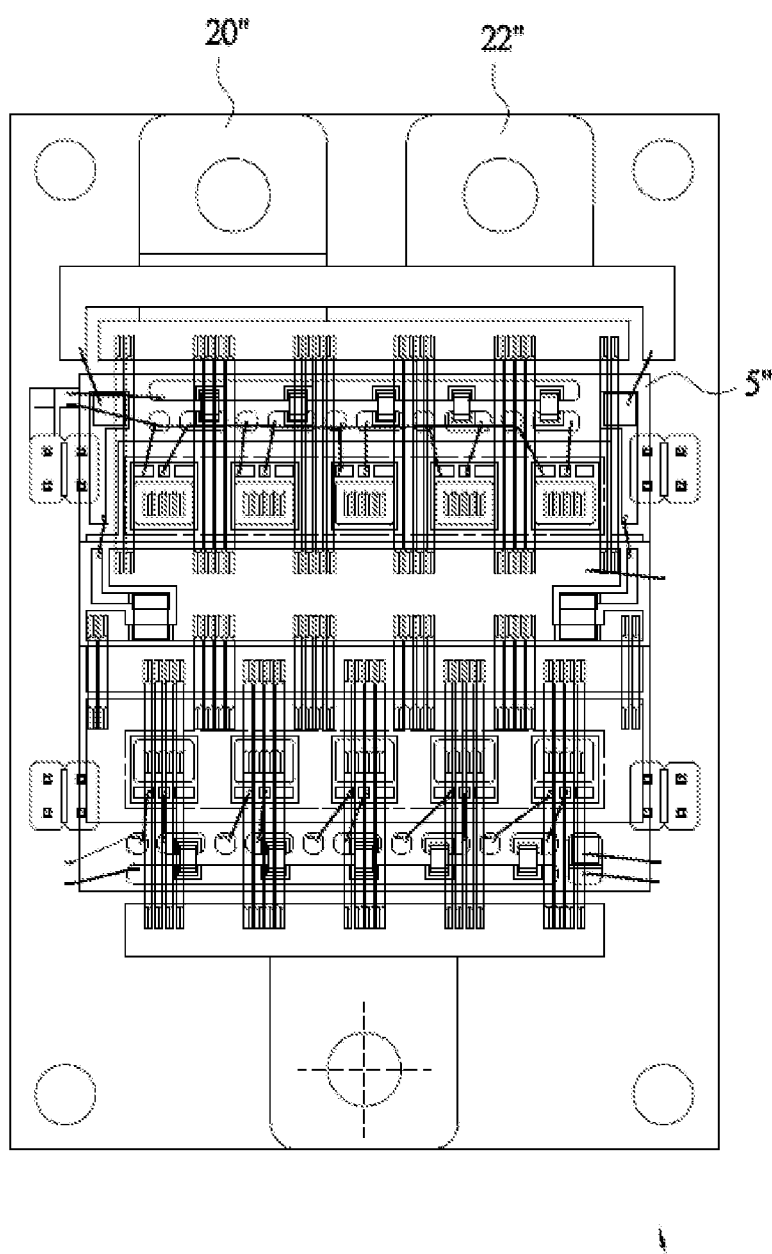
FIG. 8 is a top view of the third example of the present disclosure.
Figure 9:
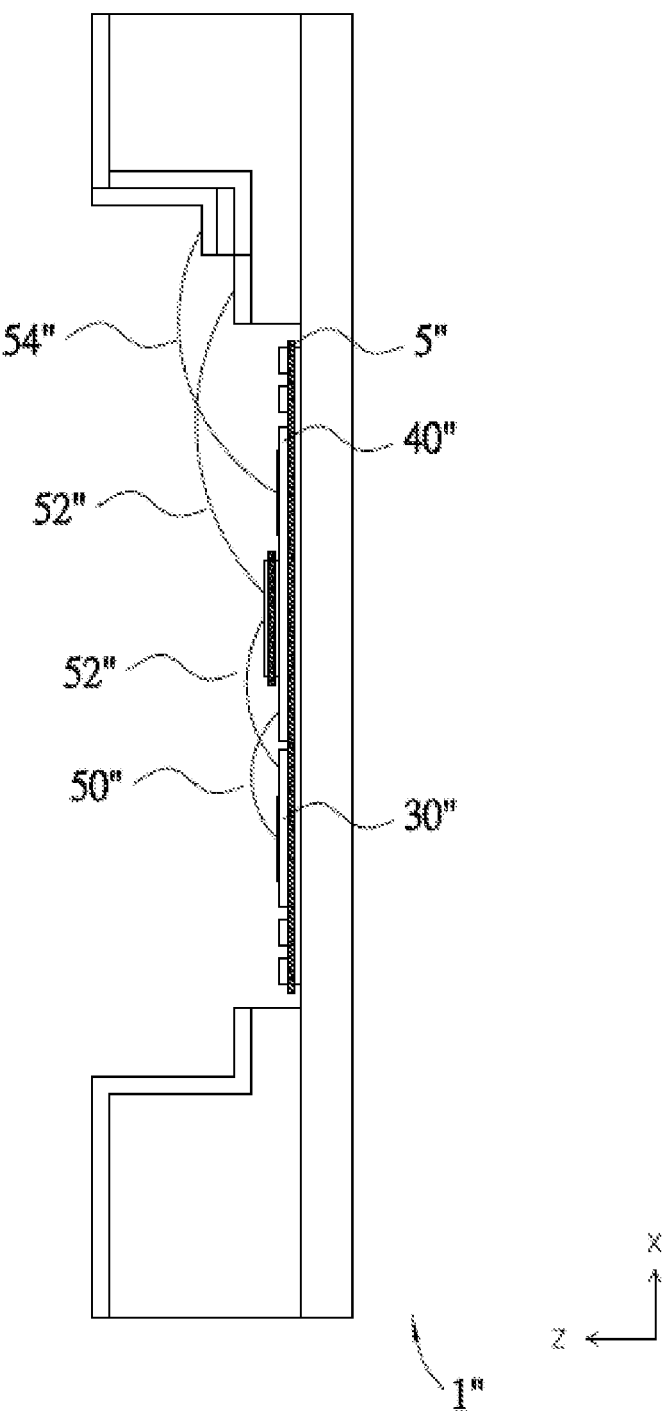
FIG. 9 is a side view of the example of FIG. 8.

Although the first circuit base portion and the second circuit base portion in the two examples above are illustrated as two standalone circuit boards, the circuit configuration of the present disclosure is not limited thereto. FIGS. 8 and 9 illustrate a third example of the power module 1" of the present disclosure, in which the current input bus-bar 20" and the current output bus-bar 22", as well as the definitions of direction X, direction Y, and direction Z, which are the same as those in the second example, will not be detailed here. This example differs from the second example mainly in that the base 5" in this example is a dielectric-layer substrate and the first circuit base portion 30" and the second circuit base portion 40" are both metal circuit layers mutually insulative on the dielectric layer, such that in the structural layout, the distance between the copper layers may be made closer than lithography. Like in the second example, in this example, when the input current route and the output current route correspond at the lengthwise position, the projections of the staggered serial-connection conductors 50", the staggered input conductive members 52", and the staggered output conductive members 54" exhibit a staggered, interleaving arrayment in the plane formed by the length direction and the width direction, in which the projections of the staggered serial-connection conductors 50" and the staggered input conductive members 52" exhibit an intersection in the plane formed by direction X and direction Z, so do the projections of the staggered input conductive members 52" and the staggered output conductive members 54"; therefore, it may be seen that, with the staggered, interleaving architecture, the current input half and the current output half of the overall loop maintains the round-trip paralleled circuits to be noticeably staggered in the width direction, causing the input conductive members and the output conductive members to be in very close proximity in the three-dimensional space.

Figure 10:
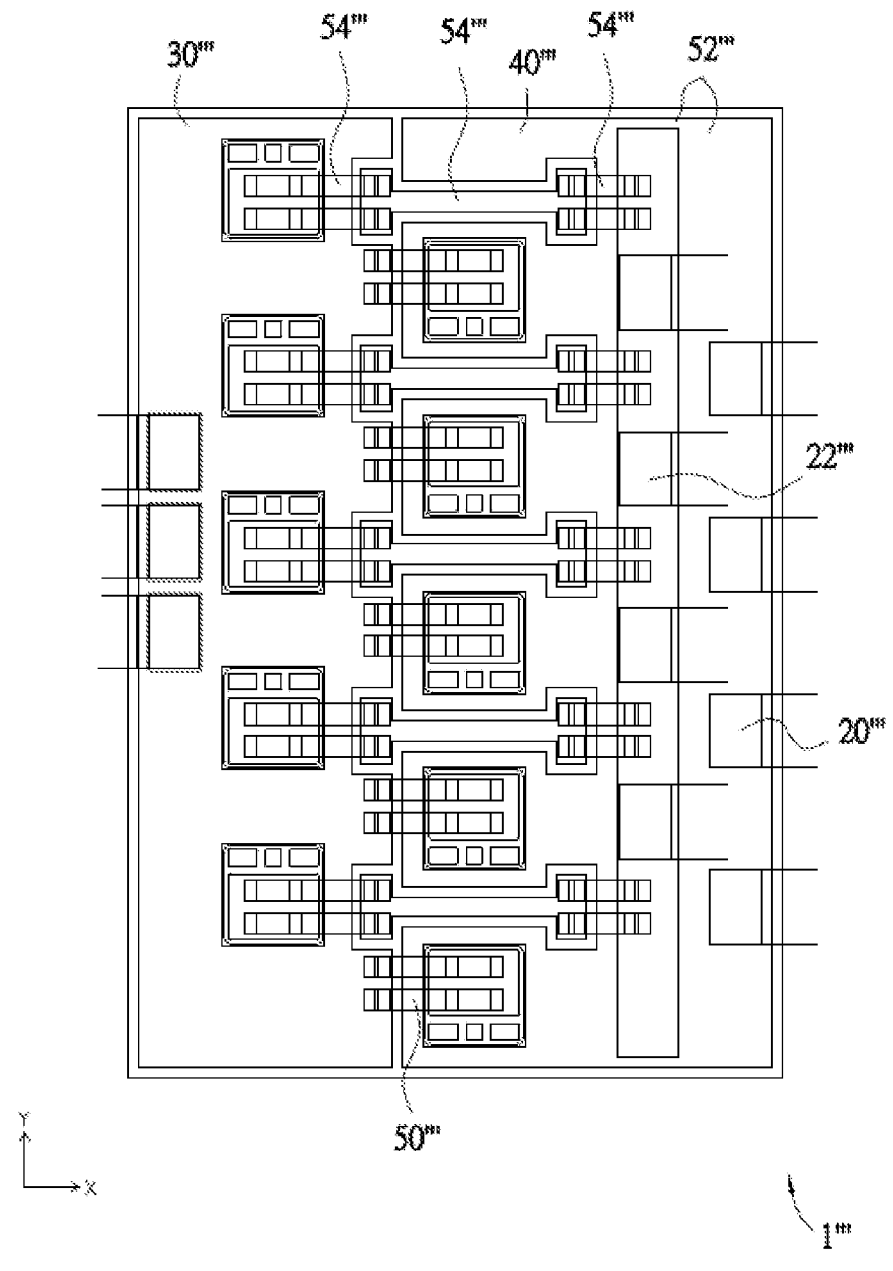
FIG. 10 is a top view of a third example of the present disclosure.

FIG. 10 illustrates a power module 1''' according to the third example of the present disclosure, wherein those components identical to the preceding two examples will not be detailed. In this example, the first circuit base portion 30''' and the second circuit base portion 40''' are conductive copper layers mutually insulative, in which the input current is inputted from the current input bus-bar 20''', flows through the first power devices and the serial-connection conductors 50''' into the second power devices, and then flows back through three segments of output conductive members 54''' to the current output bus-bar 22'''. Among the three segments of output conductive members 54''', one segment of the output conductive members 54''' is of a structure comprising 5 elongated copper layers. In addition, the input conductive members 52''' in this example are not generally known wires, but electrically conductive metal layers such as copper layers, which shows that the conductive members in the present disclosure should not be limited to known wires. As such, although the overall circuit is different from those in the preceding examples, it still has an optimum round-trip overlapping trace that reduces the parasitic inductance effect as much as possible, and the current also flows in a uniform and staggered fashion, which totally amounts to an ideal design. Therefore, the conductive members referred to in the present disclosure are not limited to metal wires; instead, any equivalent structures having the features of the present disclosure fall into the scope of the present disclosure.

The power module as disclosed herein enables even sharing of the input high current by the paralleled circuits and power devices, which ensures uniform distribution in the current flowing process; moreover, the circuits form an almost overlapping, staggered loop where the traces inside the module are interleaved with and corresponding to each other. This staggered, interleaving conduction topology significantly reduces the parasitic inductance effect. Accordingly, the module provided by the present disclosure may reduce the parasitic inductance till under 5 nH, or even under 2 nH; particularly, by optionally arraying the current input bus-bar and the current output bus-bar at side edges, flexibility in use is enhanced, and circuit leading-out is facilitated. The power devices, the current input bus-bar, the input conductive members, the serial-connection conductors, the output conductive members, and the current output bus-bar are all uniformly staggered in the width direction, which also ensures reduction of the time lag of the paralleled circuits with respect to high-frequency signal transmission. The illustrations of the examples above are intended only for easy understanding, not for limiting. Any equivalent effects and other variations and modifications according to the appended claims fall within the protection scope of the present disclosure.

We claim:

1. A low parasitic inductance power module featuring staggered, interleaving conductive members, comprising:

at least one base extending along a length direction, the base having two opposite side edges in the length direction, at least one current input bus-bar and at least one current output bus-bar which are mutually insulative being parallel arrayed along a width direction perpendicular to the length direction;

a first unit comprising a first circuit base portion, the first base portion being disposed on the base along the width direction, a plurality of first power devices being provided on the first circuit base portion in a uniformly staggered fashion, each of the first power devices having a first current input end and a first current output end, the first current input ends of all first power devices being parallel connected, the first current output ends of all first power devices being parallel connected, wherein the first current input ends are conductively mounted to the first circuit base portion, or alternatively, the first current output ends are conductively mounted to the first circuit base portion; and a second unit comprising a second circuit base portion, the second circuit base portion being disposed on the base along the width direction, the second circuit base portion being spaced from the first circuit base portion in the length direction, a plurality of second power devices being disposed on the second circuit base portion in a uniformly staggered fashion, each of the second power devices having a second current input end and a second current output end, the second current input ends of all second power devices being parallel connected, the second current output ends of all second power devices being parallel connected, wherein the second current input ends are conductively mounted to the second circuit base portion, or alternatively, the second current output ends are conductively mounted to the second circuit base portion;

wherein one end of the first unit and one end of the second unit are serially connected along the length direction via a plurality of serial-connection conductors which are configured in a mutually staggered fashion, respectively; the opposite other end of the first unit and the opposite other end of the second unit are serially connected to the current input bus-bar and the current output bus-bar via a plurality of input conductive members which are configured in a mutually staggered fashion and a plurality of output conductive members which are configured in a mutually staggered fashion, respectively; and when the serial-connection conductors, the input conductive members, and the output conductive members have their positions correspond in the length direction, their projections on a plane formed by the length direction and the width direction are arrayed in a staggered, interleaving fashion, and their projections on a plane formed by the length direction and a height direction perpendicular both to the length direction and the width direction are intersected with each other; whereby the staggered serial-connection conductors, the staggered input conductive members, and the staggered output conductive members create individual inductances which are mutually cancelled when current flows therethrough, reducing overall parasitic inductance.

2. The low parasitic inductance power module featuring staggered, interleaving conductive members according to claim 1, wherein the base is a dielectric layer, and the first circuit base portion and the second circuit base portion refer to two metal circuit layers formed on the dielectric layer and insulated from each other.

3. The low parasitic inductance power module featuring staggered, interleaving conductive members according to claim 2, wherein when the serial-connection conductors, the input conductive members, and the output conductive members have their projections overlap in the length direction, the serial-connection conductors which are configured in a mutually staggered fashion, the input conductive members which are configured in a mutually staggered fashion, and the output conductive members which are configured in a mutually staggered fashion have their projections uniformly staggered in the width direction and arrayed in a mutually staggered, interleaving fashion.

4. The low parasitic inductance power module featuring staggered, interleaving conductive members according to claim 2, further comprising a substrate disposed on the dielectric layer along the width direction, the current input bus-bar and the current output bus-bar being arrayed on the substrate.

5. The low parasitic inductance power module featuring staggered, interleaving conductive members according to claim 4, wherein the substrate is disposed between the first power devices and the second power devices along the length direction.

6. The low parasitic inductance power module featuring staggered, interleaving conductive members according to claim 1, wherein the base is an electrically insulated base, and the first circuit base portion and the second circuit base portion are two circuit boards disposed on the electrically insulated base, respectively.

7. The low parasitic inductance power module featuring staggered, interleaving conductive members according to claim 6, wherein when the serial-connection conductors, the input conductive members, and the output conductive members are correspondingly positioned in the length direction, the serial-connection conductors which are configured in a mutually staggered fashion, the input conductive members which are configured in a mutually staggered fashion, and the output conductive members which are configured in a mutually staggered fashion have their projections in the width direction uniformly disposed in the width direction, and in the plane formed by the length direction and the height direction are interleaved with each other.

* * * * *